US010199603B2

(12) United States Patent
Pieper et al.

(10) Patent No.: US 10,199,603 B2
(45) Date of Patent: Feb. 5, 2019

(54) ADHESIVE BARRIER FILM CONSTRUCTION

(71) Applicant: 3M INNOVATIVE PROPERTIES COMPANY, St. Paul, MN (US)

(72) Inventors: Joseph M. Pieper, Minneapolis, MN (US); Eric W. Nelson, Stillwater, MN (US); Fred B. McCormick, Maplewood, MN (US); Karissa L. Eckert, Blaine, MN (US); Adam M. Nebraska, St. Paul, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 0 days.

(21) Appl. No.: 14/907,276

(22) PCT Filed: Jul. 22, 2014

(86) PCT No.: PCT/US2014/047516
§ 371 (c)(1),
(2) Date: Jan. 23, 2016

(87) PCT Pub. No.: WO2015/013225
PCT Pub. Date: Jan. 29, 2015

(65) Prior Publication Data
US 2016/0164031 A1 Jun. 9, 2016

Related U.S. Application Data

(60) Provisional application No. 61/857,831, filed on Jul. 24, 2013.

(51) Int. Cl.
*H01L 51/56* (2006.01)
*C09J 5/00* (2006.01)
*C08J 7/04* (2006.01)
*H01L 51/52* (2006.01)
*G02F 1/13357* (2006.01)
*H01L 27/32* (2006.01)
*H01L 51/00* (2006.01)
*H01L 51/50* (2006.01)
*G02F 1/1335* (2006.01)

(52) U.S. Cl.
CPC ......... *H01L 51/5256* (2013.01); *C08J 7/045* (2013.01); *C09J 5/00* (2013.01); *G02F 1/1336* (2013.01); *H01L 27/3244* (2013.01); *H01L 51/004* (2013.01); *H01L 51/0094* (2013.01); *H01L 51/502* (2013.01); *H01L 51/5246* (2013.01); *H01L 51/5262* (2013.01); *H01L 51/56* (2013.01); *C08J 2367/02* (2013.01); *C08J 2433/08* (2013.01); *C09J 2205/31* (2013.01); *G02F 2001/133614* (2013.01); *H01L 2227/323* (2013.01)

(58) Field of Classification Search
None
See application file for complete search history.

(56) References Cited

U.S. PATENT DOCUMENTS

| 4,696,719 A | 9/1987 | Bischoff |
| 4,722,515 A | 2/1988 | Ham |
| 4,842,893 A | 6/1989 | Yializis |
| 4,954,371 A | 9/1990 | Yializis |
| 5,018,048 A | 5/1991 | Shaw |
| 5,032,461 A | 7/1991 | Shaw |
| 5,097,800 A | 3/1992 | Shaw |
| 5,125,138 A | 6/1992 | Shaw |
| 5,440,446 A | 8/1995 | Shaw |
| 5,547,908 A | 8/1996 | Furuzawa |
| 5,725,909 A | 3/1998 | Shaw |
| 6,045,864 A | 4/2000 | Lyons |
| 6,214,422 B1 | 4/2001 | Yializis |
| 6,231,939 B1 | 5/2001 | Shaw |
| 7,018,713 B2 | 3/2006 | Padiyath |
| 2004/0195967 A1 | 10/2004 | Padiyath |
| 2008/0157656 A1 | 7/2008 | Liao |
| 2009/0061223 A1* | 3/2009 | Tsukahara ............... B32B 7/12 428/349 |
| 2009/0169904 A1 | 7/2009 | Yamada |

(Continued)

FOREIGN PATENT DOCUMENTS

| EP | 2033988 | 3/2009 |
| EP | 2 289 983 | 3/2011 |

(Continued)

OTHER PUBLICATIONS

Affinito, "Polymer-Oxide Transparent Barrier Layers", Society of Vacuum Coaters, 39th Annual Technical Conference Proceedings, 1996, pp. 392-397.
Affinito, "Vacuum deposited polymer/metal multilayer films for optical application", Thin Solid Films, 1995, vol. 270, pp. 43-48.
Shaw, "A New High Speed Process for Vapor Depositing Acrylate Thin Films: An Update", Society of Vacuum Coaters, 36th Annual Technical Conference Proceedings, Apr. 25-30, 1993, pp. 348-352.
Shaw, "A New Vapor Deposition Process for Coating Paper and Polymer Webs", 6th International Vacuum Coating Conference, Oct. 28, 1992; pp. 18-24.

(Continued)

Primary Examiner — Sheeba Ahmed
(74) Attorney, Agent, or Firm — Lisa P. Fulton

(57) ABSTRACT

The present disclosure relates to forming a bond with a high peel resistance between a bonding layer and an adjacent barrier layer. Such articles are particularly useful in the preparation of a device, in particular a luminescent device, and a method is described for assembly of the luminescent device. The luminescent device includes an encapsulation system using flexible transparent barrier film and an ultraviolet (UV) radiation curable (meth)acrylate matrix. The moisture sensitive luminescent material can be, for example, a quantum dot material disposed in a film, or a film construction that includes an OLED structure.

6 Claims, 2 Drawing Sheets

(56) References Cited

U.S. PATENT DOCUMENTS

| | | |
|---|---|---|
| 2009/0282810 A1 | 11/2009 | Leone |
| 2010/0237322 A1 | 9/2010 | Okada et al. |
| 2011/0223434 A1 | 9/2011 | Roehrig |
| 2012/0003484 A1 | 1/2012 | Roehrig |
| 2012/0208033 A1 | 8/2012 | Weigel |
| 2013/0323519 A1 | 12/2013 | Klun |
| 2015/0213990 A1 | 7/2015 | Spagnola |

FOREIGN PATENT DOCUMENTS

| | | |
|---|---|---|
| EP | 2301748 | 3/2011 |
| EP | 2 730 610 | 5/2014 |
| EP | 2 749 409 | 7/2014 |
| JP | 2012-020409 | 2/2012 |
| WO | WO 2000-26973 | 5/2000 |
| WO | 01/669997 | 3/2001 |
| WO | WO 2012-106184 | 8/2012 |
| WO | WO 2013-062486 | 5/2013 |
| WO | WO 2014-025387 | 2/2014 |
| WO | WO 2014-025570 | 2/2014 |
| WO | WO 2014-025983 | 2/2014 |
| WO | WO 2014-113562 | 7/2014 |

OTHER PUBLICATIONS

Shaw, "Use of Evaporated Acrylate Coatings to Smooth the Surface of Polyester and Polypropylene Film Substrates", RadTech' 96 North America UV/EB Conference Proceedings, Apr. 28-May 2, 1996, vol. 2, pp. 701-707.

Shaw, "Use of Vapor Deposited Acrylate Coatings to Improve the Barrier Properties of Metallized Film", Society of Vacuum Coaters, 37th Annual Technical Conference Proceedings, 1994, pp. 240-247.

International Search Report for PCT International Application No. PCT/US2014/0475516 dated Jan. 9, 2015, 4 pages.

\* cited by examiner

ADHESIVE BARRIER FILM CONSTRUCTION

BACKGROUND

Certain materials useful in the preparation of luminescent devices, such as organic light emitting diodes (OLED) and quantum dots, undergo oxidative damage when exposed to air and moisture, often resulting in a loss of luminescence. While the preparation of barrier layers effective against the penetration of air and moisture are known, attempts to bond such layers to convenient polymeric matrices incorporating the sensitive material have resulted in poor interlayer adhesion.

SUMMARY

The present disclosure relates to forming a bond with a high peel resistance between a bonding layer and an adjacent barrier layer. Such articles are particularly useful in the preparation of a device, in particular a luminescent device, and a method is described for assembly of the luminescent device. The luminescent device includes an encapsulation system using flexible transparent barrier film and an ultraviolet (UV) radiation curable (meth)acrylate matrix. The moisture sensitive luminescent material can be, for example, a quantum dot material disposed in a film, or a film construction that includes an OLED structure. In one aspect, the present disclosure provides a device that includes: a first and a second barrier layer, each including at least an outer polymer layer, each outer polymer layer having an adhesive contact surface; and a luminescent layer having a polymer matrix disposed between the first and the second barrier layers with the respective adhesive contact surfaces in contact with the luminescent layer, wherein a peel adhesion between the first and the second barrier layers and the luminescent layer is at least 100 grams/inch. In another aspect, the present disclosure provides a display that includes the device, a light disposed to illuminate the device; and a liquid crystal display panel disposed between the light and the device.

In yet another aspect, the present disclosure provides a device that includes: a barrier film and a bonding layer. The barrier film including: a polymeric substrate having opposing first and second major surfaces; an inorganic oxide layer adjacent the second major surface; a smoothing polymeric layer between the second major surface and the inorganic oxide layer; and an outer polymer layer disposed on the inorganic oxide layer, opposite the smoothing polymeric layer. The bonding layer is disposed adjacent the outer polymer layer, wherein a peel adhesion between the barrier film and the bonding layer is at least 100 grams/inch. In yet another aspect, the present disclosure provides a display that includes the device, a light disposed to illuminate the device; and a liquid crystal display panel disposed between the light and the device.

In yet another aspect, the present disclosure provides a device that includes: a barrier film and a bonding layer. The barrier film including: a polymeric substrate having opposing first and second major surfaces; an inorganic oxide layer adjacent the second major surface; a smoothing polymeric layer between the second major surface and the inorganic oxide layer; and an outer polymer layer disposed on the inorganic oxide layer, opposite the smoothing polymeric layer. The bonding layer is disposed adjacent the outer polymer layer, wherein a peel adhesion between the barrier film and the bonding layer is at least 100 grams/inch. The device further includes a second barrier film that has: a second polymeric substrate having opposing third and fourth major surfaces; a second inorganic oxide layer adjacent the fourth major surface; a second smoothing polymeric layer between the fourth major surface and the second inorganic oxide layer; and a second outer polymer layer disposed on the second inorganic oxide layer, opposite the second smoothing polymeric layer, wherein the bonding layer is disposed adjacent the second inorganic oxide layer and opposite the second smoothing polymeric layer. In yet another aspect, the present disclosure provides a display that includes the device, a light disposed to illuminate the device; and a liquid crystal display panel disposed between the light and the device.

In yet another aspect, the present disclosure provides a method of forming a device that includes forming a barrier film in an evacuated chamber, the barrier film having an outer radiation curable polymer layer; at least partially curing the outer radiation curable polymer layer so as to form an adhesive contact surface on the barrier film; and forming a bonding layer on the adhesive contact surface.

In yet another aspect, the present disclosure provides a method of forming a device that includes forming a barrier film in an evacuated chamber, the barrier film having an outer radiation curable polymer layer; at least partially curing the outer radiation curable polymer layer so as to form an adhesive contact surface on the barrier film; laminating the barrier film to a bonding layer comprising a curable polymer matrix, so that the adhesive contact surface contacts the bonding layer; and curing the laminate.

The above summary is not intended to describe each disclosed embodiment or every implementation of the present disclosure. The figures and the detailed description below more particularly exemplify illustrative embodiments.

BRIEF DESCRIPTION OF THE DRAWINGS

Throughout the specification reference is made to the appended drawings, where like reference numerals designate like elements, and wherein.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1:
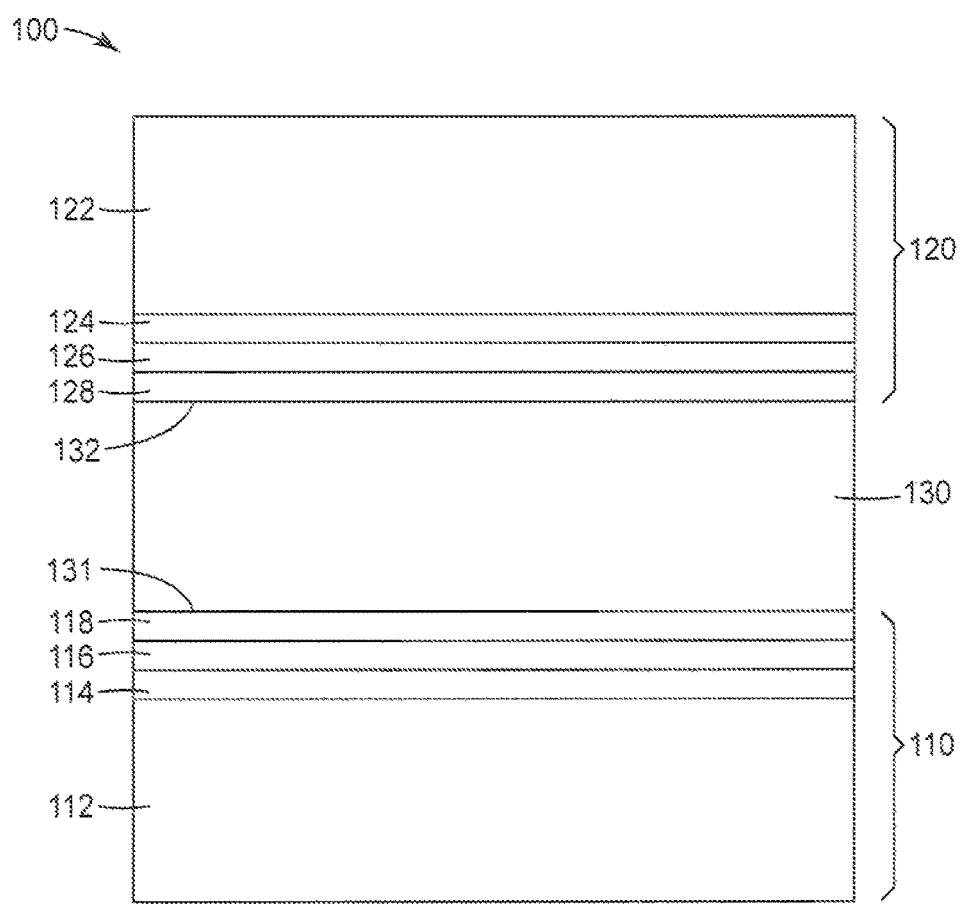
FIG. 1 shows a cross-sectional schematic view of a device.

The present disclosure provides for the construction of a device, in particular a luminescent device, and a method for assembly of the luminescent device. The luminescent device includes an encapsulation system using flexible transparent barrier film and an ultraviolet (UV) radiation curable (meth)acrylate matrix. The moisture sensitive luminescent material can be, for example, a quantum dot material disposed in a film, or a film construction that includes an OLED structure. In one particular embodiment, the luminescent device includes a high optical transmission barrier film, high barrier properties of the UV curable (meth)acrylate matrix containing the quantum dots, and high adhesion of the UV curable acrylate matrix to the barrier film for durability during converting and product use. In one particular embodiment, the barrier films produced can be useful for bonding to other materials, such as polymeric hot-melt materials, pressure sensitive adhesives, hard coats, and the like.

Certain terms are used throughout the description and the claims that, while for the most part are well known, may require some explanation. It should understood that, as used herein:

The term "(meth)acrylate" with respect to a monomer means a vinyl-functional alkyl ester formed as the reaction product of an alcohol with an acrylic or a methacrylic acid, for example, acrylic acid or methacrylic acid.

The term "(co)polymer" means a homopolymer or a copolymer.

The term "homogeneous" means exhibiting only a single phase of matter when observed at a macroscopic scale.

Various exemplary embodiments of the disclosure will now be described with particular reference to the Drawings. Exemplary embodiments of the present disclosure may take on various modifications and alterations without departing from the spirit and scope of the disclosure. Accordingly, it is to be understood that the embodiments of the present disclosure are not to be limited to the following described exemplary embodiments, but are to be controlled by the limitations set forth in the claims and any equivalents thereof.

In the following description, reference is made to the accompanying drawings that forms a part hereof and in which are shown by way of illustration. It is to be understood that other embodiments are contemplated and may be made without departing from the scope or spirit of the present disclosure. The following detailed description, therefore, is not to be taken in a limiting sense.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

As used in this specification and the appended claims, the singular forms "a," "an," and "the" encompass embodiments having plural referents, unless the content clearly dictates otherwise. As used in this specification and the appended claims, the term "or" is generally employed in its sense including "and/or" unless the content clearly dictates otherwise.

Spatially related terms, including but not limited to, "lower," "upper," "beneath," "below," "above," and "on top," if used herein, are utilized for ease of description to describe spatial relationships of an element(s) to another. Such spatially related terms encompass different orientations of the device in use or operation in addition to the particular orientations depicted in the figures and described herein. For example, if an object depicted in the figures is turned over or flipped over, portions previously described as below or beneath other elements would then be above those other elements.

As used herein, when an element, component or layer for example is described as forming a "coincident interface" with, or being "on" "connected to," "coupled with" or "in contact with" another element, component or layer, it can be directly on, directly connected to, directly coupled with, in direct contact with, or intervening elements, components or layers may be on, connected, coupled or in contact with the particular element, component or layer, for example. When an element, component or layer for example is referred to as being "directly on," "directly connected to," "directly coupled with," or "directly in contact with" another element, there are no intervening elements, components or layers for example.

Current liquid crystal displays (LCDs) may present only 50% of the NTSC standard. OLED displays, a competing technology, may present greater than 100% of the NTSC standard. The use of quantum dot emitting film (QDEF) allows LCD manufacturers to increase the color gamut with their current technology platform, without significant changes to their supply chain or technology platform.

In some cases, QDEF can be used for increasing the color gamut of LCDs across a wide range of applications including television, monitor, notebook, and handheld devices. A full-UV QDEF system that includes increased throughput speed is desired. In some cases, certain quantum dot chemistries can be incompatible with a traditional thermally-cured epoxy-amine polymer matrix, thereby limiting the types of quantum dots that can be used for QDEF constructions.

Quantum dot films and elements are utilized in display and other optical constructions. The quantum dots need to be sealed from oxygen and water, and are typically dispersed in a polymer matrix, which can then be sealed between flexible transparent barrier films. The polymer matrix can be a hot melt matrix, a thermally cured matrix such as epoxy, a hybrid matrix such as a radiation curable (meth)acrylate blended with an epoxy amine that undergoes radiation cure of the (meth)acrylate to stabilize the matrix during subsequent thermal cure, or the polymer matrix can be a radiation curable (meth)acrylate material such that a subsequent thermal cure is not necessary.

The continuous roll-to-roll manufacture of flexible transparent barrier films has been developed for oxygen- and moisture-sensitive applications requiring high optical transmission. Examples of such roll-to-roll manufacturing methods and the barrier films produced by these methods can be found, for example, in U.S. Pat. No. 5,440,446 (Shaw et al.) entitled ACRYLATE COATING MATERIAL; U.S. Pat. No. 5,725,909 (Shaw et al.) entitled ACRYLATE COMPOSITE BARRIER COATING PROCESS; U.S. Pat. No. 6,231,939 (Shaw et al.) entitled ACRYLATE COMPOSITE BARRIER COATING; and U.S. Pat. No. 7,018,713 (Padiyath et al.) entitled FLEXIBLE HIGH-TEMPERATURE ULTRABARRIER; and also in U.S. Patent Publication Nos. 2011/0223434 (Roehrig et al.) entitled GRADIENT COMPOSITION BARRIER; and 2012/0003484 (Roehrig et al.) entitled MOISTURE RESISTANT COATING FOR BARRIER FILMS; and also in U.S. Patent Application No. 61/754,786 (Nelson et al.) entitled QUANTUM DOT FILM.

Barrier film production typically is conducted in a near-vacuum environment, and uses a high Tg polymeric substrate onto which a first radiation curable resin is applied as a smoothing layer, this first layer can be cured using, for example, UV or electron beam radiation. Next, an inorganic oxide barrier layer is coated (for example by sputtering) onto the surface of the smoothing layer, and a second radiation curable resin is applied as protective layer, which is then cured again using similar techniques. Each of the pairs of inorganic oxide barrier layer/protective layer are often referred to as "dyads", and any desired multiple of the dyads can be applied on top of one another to improve the barrier properties of the barrier film. The benefits of electron-beam curing include a high degree of crosslinking and the ability to cure at high line speeds with no photo-initiator in the monomer feed.

An alternative to e-beam curing is UV curing. Typically for such a system, a specific UV light emitted from a bulb is coupled with a specific photo-initiator blended into the liquid monomer. The photo-initiator is selected to match the emission wavelength from the UV light. In some cases, another alternative to e-beam curing is visible-light curing, in which a specific photo-initiator is blended into the liquid monomer and is selected to match the emission wavelength from the visible light. Suitable UV or visible light sources are well known in the art, and include UV LEDs; UV lasers; UV lamps including low pressure germicidal lamps, medium and high pressure lamps; visible lamps, flashlamps, and the like.

A high durability QDEF product is desirable for further converting, handling, and long product lifetimes, and high adhesion of the quantum dot polymer matrix to the encapsulating barrier film improves the durability of the QDEF. The UV curable quantum dot matrix formulations typically exhibit poor adhesion to electron-beam cured barrier film. The present inventors have discovered the surprising and unexpected result that a significant increase in adhesion of the barrier layer to the quantum dot matrix results when the topmost acrylate layer (i.e., protective layer) in the barrier stack is UV cured instead of using the typical electron-beam curing in barrier film construction. Further, the present inventors have discovered the surprising and unexpected result that the barrier layer adhesion to other materials such as hot-melt adhesives similar to ethylene vinyl acetate (EVA) hot melt can be improved using the UV cured barrier stack. Still further, the present inventors have discovered the surprising and unexpected result that the inclusion of certain free-radical inhibitors in the UV cured outer polymer layers also can improve adhesion to UV cured resins and other materials such as hot-melts, while also reducing the tendency for adjacent layers in rolls of the barrier films to adhere to one another.

FIG. 1 shows a cross-sectional schematic view of a luminescent device 100, according to one aspect of the disclosure. Luminescent device 100 includes a first barrier film 110, an optional second barrier film 120, and a luminescent layer 130 disposed between the first and optional second barrier films 110, 120. It is to be understood that in the description that follows, both first and second barrier films 110, 120 are included; however, in some cases only one barrier film may be used.

The first barrier film 110 includes a first substrate 112, a first polymeric smoothing layer 114 disposed on the first substrate 112, a first barrier layer 116 disposed on the first polymeric smoothing layer 114, and a first outer polymer layer 118 disposed on the first barrier layer 116. The optional second barrier film 120 includes a second substrate 122, a second polymeric smoothing layer 124 disposed on the second substrate 122, a second barrier layer 126 disposed on the second polymeric smoothing layer 124, and a second outer polymer layer 128 disposed on the second barrier layer 126.

The luminescent layer 130 is disposed between the first and second barrier films 110, 120, such that each of the first outer polymer layer 118 and the second outer polymer layer 128 are in contact with a first major surface 131 and an opposing second major surface 132, respectively, of the luminescent layer 130. The first barrier layer 116 and the second barrier layer 126 are resistant to the transmission of oxygen and water vapor. In some embodiments where even higher levels of barrier properties are wanted, a stack with more pairs of barrier layers and additional polymer layers (i.e., dyads) can be provided.

Each of the first and second substrates 112, 122, can be the same or different, and can be selected from glasses such as a flexible glass, e.g., Willow Glass available from Corning, and Ultra Thin glasses available from both Schott and Asahi; metal foils; and polymers such as polyethylene terephthalate (PET), heat-stabilized polyethylene terephthalate (HSPET), polyethylene naphthalate (PEN), polymethyl methacrylate (PMMA), styrene/acrylonitrile (SAN), styrene/maleic anhydride (SMA), polyoxymethylene (POM), polyvinylnaphthalene (PVN), polyetheretherketone (PEEK), polyaryletherketone (PAEK), high Tg fluoropolymers (e.g., DYNEON™ HTE terpolymer of hexafluoropropylene, tetrafluoroethylene, and ethylene), polycarbonate (PC), poly α-methyl styrene, polyarylate (PAR), polysulfone (PSul), polyphenylene oxide (PPO), polyetherimide (PEI), polyarylsulfone (PAS), poly ether sulfone (PES), polyamideimide (PAI), polyimide, polyphthalamide, cyclic olefin polymers (COP), cyclic olefin copolymers (COC), and triacetate cellulose (TAC). For applications where material costs are important, substrates made of PET, HSPET and PEN are especially preferred. Preferably the substrate has a thickness of about 0.01 to about 1 mm, more preferably about 0.05 to about 0.25 mm. In one particular embodiment, each of the first and second substrates are PET.

Each of the first and second polymeric smoothing layers 114, 124, can be the same or different, and can be selected from polymers including urethane acrylates (e.g., CN-968 and CN-983, both commercially available from Sartomer Co.), isobornyl acrylate (e.g., SR-506, commercially available from Sartomer Co.), dipentaerythritol pentaacrylates (e.g., SR-399, commercially available from Sartomer Co.), epoxy acrylates blended with styrene (e.g., CN-120S80, commercially available from Sartomer Co.), di-trimethylolpropane tetraacrylates (e.g., SR-355, commercially available from Sartomer Co.), diethylene glycol diacrylates (e.g., SR-230, commercially available from Sartomer Co.), 1,3-butylene glycol diacrylate (e.g., SR-212, commercially available from Sartomer Co.), pentaacrylate esters (e.g., SR-9041, commercially available from Sartomer Co.), pentaerythritol tetraacrylates (e.g., SR-295, commercially available from Sartomer Co.), pentaerythritol triacrylates (e.g., SR-444, commercially available from Sartomer Co.), ethoxylated (3) trimethylolpropane triacrylates (e.g., SR-454, commercially available from Sartomer Co.), ethoxylated (3) trimethylolpropane triacrylates (e.g., SR-454HP, commercially available from Sartomer Co.), alkoxylated trifunctional acrylate esters (e.g., SR-9008, commercially available from Sartomer Co.), dipropylene glycol diacrylates (e.g., SR-508, commercially available from Sartomer Co.), neopentyl glycol diacrylates (e.g., SR-247, commercially available from Sartomer Co.), ethoxylated (4) bisphenol a dimethacrylates (e.g., CD-450, commercially available from Sartomer Co.), cyclohexane dimethanol diacrylate esters (e.g., CD-406, commercially available from Sartomer Co.), cyclic diacrylates such as, for example, tricyclodecane dimethanol diacrylates (e.g., SR-833S, commercially available from Sartomer Co.), isobornyl methacrylate (e.g., SR-423, commercially available from Sartomer Co.), and tris(2-hydroxy ethyl)isocyanurate triacrylate (e.g., SR-368, commercially available from Sartomer Co.), acrylates of the foregoing methacrylates and methacrylates of the foregoing acrylates.

Each of the first and second polymeric smoothing layers 114, 124, can be formed by applying a layer of a monomer or oligomer to the respective first and second substrate 112, 122, and crosslinking the layer to form the polymer in situ, e.g., by flash evaporation and vapor deposition of a radiation-crosslinkable monomer, followed by crosslinking using, for example, an electron beam apparatus, UV light source, electrical discharge apparatus or other suitable device. Coating efficiency can be improved by cooling the support. The monomer or oligomer can also be applied to the substrate using conventional coating methods such as roll coating (e.g., gravure roll coating) or spray coating (e.g., electrostatic spray coating), then crosslinked as set out above. The first polymer layer can also be formed by applying a layer containing an oligomer or polymer in solvent and drying the thus-applied layer to remove the solvent. Plasma polymerization may also be employed. Most preferably, the first polymer layer is formed by flash evaporation and vapor deposition followed by crosslinking in situ, e.g., as described in U.S. Pat. No. 4,696,719 (Bischoff), U.S. Pat. No. 4,722,515 (Ham), U.S. Pat. No. 4,842,893 (Yializis et al.), U.S. Pat. No. 4,954,371 (Yializis), U.S. Pat. No. 5,018,048 (Shaw et al.), U.S. Pat. No. 5,032,461 (Shaw et al.), U.S. Pat. No. 5,097,800 (Shaw et al.), U.S. Pat. No. 5,125,138 (Shaw et al.), U.S. Pat. No. 5,440,446 (Shaw et al.), U.S. Pat. No. 5,547,908 (Furuzawa et al.), U.S. Pat. No. 6,045,864 (Lyons et al.), U.S. Pat. No. 6,231,939 (Shaw et al.) and U.S. Pat. No. 6,214,422 (Yializis); in published PCT Application No. WO 00/26973 (Delta V Technologies, Inc.); in D. G. Shaw and M. G. Langlois, "A New Vapor Deposition Process for Coating Paper and Polymer Webs", 6th International Vacuum Coating Conference (1992); in D. G. Shaw and M. G. Langlois, "A New High Speed Process for Vapor Depositing Acrylate Thin Films: An Update", Society of Vacuum Coaters 36th Annual Technical Conference Proceedings (1993); in D. G. Shaw and M. G. Langlois, "Use of Vapor Deposited Acrylate Coatings to Improve the Barrier Properties of Metallized Film", Society of Vacuum Coaters 37th Annual Technical Conference Proceedings (1994); in D. G. Shaw, M. Roehrig, M. G. Langlois and C. Sheehan, "Use of Evaporated Acrylate Coatings to Smooth the Surface of Polyester and Polypropylene Film Substrates", RadTech (1996); in J. Affinito, P. Martin, M. Gross, C. Coronado and E. Greenwell, "Vacuum deposited polymer/metal multilayer films for optical application", Thin Solid Films 270, 43-48 (1995); and in J. D. Affinito, M. E. Gross, C. A. Coronado, G. L. Graff, E. N. Greenwell and P. M. Martin, "Polymer-Oxide Transparent Barrier Layers", Society of Vacuum Coaters 39th Annual Technical Conference Proceedings (1996).

The smoothness and continuity of the first and second polymeric smoothing layer 114, 124, and its adhesion to the underlying substrate preferably is enhanced by appropriate pretreatment. A preferred pretreatment regimen employs an electrical discharge in the presence of a suitable reactive or non-reactive atmosphere (e.g., plasma, glow discharge, corona discharge, dielectric barrier discharge or atmospheric pressure discharge); chemical pretreatment or flame pretreatment. These pretreatments help make the surface of the underlying layer more receptive to formation of the subsequently applied polymeric layer. Plasma pretreatment is particularly preferred. A separate adhesion promotion layer which may have a different composition than the high Tg polymer layer may also be utilized atop an underlying layer to improve interlayer adhesion. The adhesion promotion layer can be, for example, a separate polymeric layer or a metal-containing layer such as a layer of metal, metal oxide, metal nitride or metal oxynitride. The adhesion promotion layer may have a thickness of a few nm (e.g., 1 or 2 nm) to about 50 nm, and can be thicker if desired.

The desired chemical composition and thickness of the first and second polymeric smoothing layer 114, 124, will depend in part on the nature and surface topography of the respective first and second substrate 112, 122. The thickness preferably is sufficient to provide a smooth, defect-free surface to which the subsequent first inorganic barrier layer can be applied. For example, the first polymer layer may have a thickness of a few nm (e.g., 2 or 3 nm) to about 5 micrometers, and can be thicker if desired.

The first and second barrier layers 116, 126, can respectively be referred to as the "first inorganic barrier layer" and "second inorganic barrier layer". Additional inorganic barrier layers and polymer layers can be present if desired. The first and second barrier layers 116, 126, do not have to be the same. A variety of inorganic barrier materials can be employed. Preferred inorganic barrier materials include metal oxides, metal nitrides, metal carbides, metal oxynitrides, metal oxyborides, and combinations thereof, e.g., silicon oxides such as silica, aluminum oxides such as alumina, titanium oxides such as titania, indium oxides, tin oxides, indium tin oxide ("ITO"), tantalum oxide, zirconium oxide, niobium oxide, boron carbide, tungsten carbide, silicon carbide, aluminum nitride, silicon nitride, boron nitride, aluminum oxynitride, silicon oxynitride, boron oxynitride, zirconium oxyboride, titanium oxyboride, and combinations thereof. Indium tin oxide, silicon oxide, aluminum oxide and combinations thereof are especially preferred inorganic barrier materials. ITO is an example of a special class of ceramic materials that can become electrically conducting with the proper selection of the relative proportions of each elemental constituent. The inorganic barrier layers preferably are formed using techniques employed in the film metallizing art such as sputtering (e.g., cathode or planar magnetron sputtering), evaporation (e.g., resistive or electron beam evaporation), chemical vapor deposition, plasma deposition, atomic layer deposition (ALD), plating and the like. Most preferably the inorganic barrier layers are formed using sputtering, e.g., reactive sputtering. Enhanced barrier properties have been observed when the inorganic layer is formed by a high energy deposition technique such as sputtering compared to lower energy techniques such as conventional chemical vapor deposition processes. Without being bound by theory, it is believed that the enhanced properties are due to the condensing species arriving at the substrate with greater kinetic energy, leading to a lower void fraction as a result of compaction. The smoothness and continuity of each inorganic barrier layer and its adhesion to the underlying layer can be enhanced by pretreatments (e.g., plasma pretreatment) such as those described above with reference to the first polymer layer.

The first and second barrier layers 116, 126, do not have to have the same thickness. The desired chemical composition and thickness of each inorganic barrier layer will depend in part on the nature and surface topography of the underlying layer and on the desired optical properties for the barrier assembly. The inorganic barrier layers preferably are sufficiently thick so as to be continuous, and sufficiently thin so as to ensure that the barrier assembly and articles containing the assembly will have the desired degree of visible light transmission and flexibility. Preferably the physical thickness (as opposed to the optical thickness) of each inorganic barrier layer is about 3 to about 150 nm, more preferably about 4 to about 75 nm.

The first and second outer polymer layers 118, 128, can be the same or different, and can comprise the same materials as the first and second polymeric smoothing layers 114, 124. In one particular embodiment, the first and second outer polymer layers 118, 128 can each comprise at least some of the same polymeric material as in the luminescent layer 130.

First and second outer polymer layers 118, 128 further include at least one photoinitiator that can interact with UV or visible light to initiate polymerization in each layer. The first and second outer polymer layers 118, 128 can be formed on top of the respective first and second barrier layers 116, 126, using any of the same techniques as described above for forming the first and second polymeric smoothing layers 114, 124 on the respective first and second substrates, with the exception that the first and second outer polymeric layers 118, 128 are crosslinked using a UV or visible light source.

In one particular embodiment, the exposure wavelength of the UV source used can be 254 nm produced by a low-pressure amalgam lamp, having a strong emission at 254 nm, and essentially no emission below 220 nm. The photo-initiator used can absorb strongly at 254 nm. The peak power density of the UV source can be 0.5 mW/cm$^2$, and the dose (exposure of cure) can range from about 0.05 to about 4 mJ/cm$^2$, or from about 0.1 to about 2 mJ/cm$^2$, or from about 0.1 to about 1 mJ/cm$^2$. In some cases, the dose can be determined by running an EIT UV PowerMAP® (available from EIT Inc., Sterling Va.) under the lamps under typical process conditions.

In some cases, longer wavelength ranges of UV can be useful for polymerization, however shorter wavelength radiation generally should be avoided. For example, an LED-lamp could emit light at 385 nm, and a TPO-based (e.g., 2,4,6-Trimethylbenzoyldiphenyl phosphine oxide) photo-initiator could be used, as TPO potoinitiators can initiate free radicals with UV-A light. In this case, the energy density would be similar to the amalgam lamp; however, this may be perhaps less practical because TPO also absorbs and can initiate polymerization with visible light, which can be less desirable in manufacturing. Other photoinitiators, for example, ESACURE ONE and ESACURE KB1 (both available from Lamberti S.p.A., Italy); Irgacure 184, Darocur 4265, and Darocur 1173 (available from BASF Resins); and others can be used, suitable for use at different wavelengths of light, and at concentrations generally up to about 3% by weight, as know to one of skill in the art.

In one particular embodiment, an optional polymerization inhibitor can be added to the crosslinkable polymer layers. The presence of the inhibitor can reduce the tendency for the polymer layers to adhere to an adjacent layer as the barrier films are rolled up during processing. Due to the very low dose required for polymerization, and since the barrier films include processing vapor coated acrylates in a vacuum, some "blocking" within the roll (that is, sticking to itself) has been observed. To overcome this tendency to "block", an inhibitor can be blended into the acrylate layer at concentrations of approximately 250 ppm. The addition of an inhibitor may not be necessary for barrier film rolls that are to be processed immediately, but may be needed for long shelf life storage and also for larger rolls. In one case, the inhibitor can be, for example, 4-hydroxy-TEMPO (4-hydroxy-2,2,6,6-tetramethylpiperidin-1-oxyl, available from Sigma-Aldrich), although other inhibitors can also be used, as known to one of skill in the art. Examples of other inhibitors include, for example, phenolics such as hydroquinone (HQ), methoxy phenol (MEHQ), catechol, pyrocatechol, resorcinol, pyrogallol, propyl gallate, and derivatives of all of these; quinines such as bezoquinone, anthraquinone, and the like; metal salts such as copper powder, CuCl, MnAc (in combination with 4-hydroxy TEMPO); nitrosos such as NPAL [tris(N-nitroso, N-phenyl hydroxylamine)aluminum salt, available from First Chemical Corp.], NPHA or cupferron (the water soluble ammonium salt of the above); aromatic amines including phenothiazine (PTZ), N,N,N',N'-tetramethyl phenylenediamine, indulin and analogs; hydroxylamines such as diethyl hydroxylamine and analogs, and salicylaldoxime; and free-radicals such as 4-hydroxy TEMPO (CIBA Prostab) and galvinoxyl; and derivatives thereof. In some cases, combinations of inhibitors can be beneficial, such as diethylhydroxyl amine and tetramethyl phenylene diamine (5-50 ppm each); salicylaldoxime and tetramethyl phenylene diamine (5-50 ppm each); Manganese acetate and 4-hydroxy TEMPO (5-10 ppm each); and NPAL and PTZ.

Further, 4-hydroxy-TEMPO has been seen to be an effective inhibitor for free-radical inhibition under anaerobic conditions. Although there is already an inhibitor in the monomer, MeHQ, this inhibitor requires oxygen to be effective, so unwrapping a roll immediately after processing at atmosphere can also be effective to prevent blocking.

In one particular embodiment, coupling agents, such as silane coupling agents, may optionally be added to the first and/or second polymeric smoothing layers 114, 124, and first and/or second outer polymer layers 118, 128, of the first and/or second barrier films 110, 120, to improve adhesion within the barrier stack. Useful coupling agents are described, for example, in co-pending U.S. Patent Publication Nos. 2012/0208033 and 2012/003484, and also in U.S. Patent Application Ser. Nos. 61/437,850 entitled "Vapor-deposited Coating for Barrier Films and Methods of Making and Using the Same", filed Jan. 31, 2011); 61/680,995 entitled "Composite Films Including a (Co)polymer Reaction Product of a Urethane (Multi)-(meth)acrylate (Multi)-silane", filed Aug. 8, 2012); 61/680,955 entitled "Barrier Film, Method of Making the Barrier Film, and Articles Including the Barrier Film", filed Aug. 8, 2012); and 61/680,963 entitled "Barrier Film Constructions and Methods of Making Same", filed Aug. 8, 2012). In some cases, cyclic azasilanes, such as N-n-butyl-aza-2,2-dimethoxysilacyclopentane available from Gelest, Inc., Morrisville, Pa., have been found to be particularly useful, but other coupling agents known to those skilled in the art may also be used.

The luminescent layer 130 can be prepared by combining quantum dot material with a polymer matrix, and polymerizing and/or crosslinking the matrix, as known to one of skill in the art. The quantum dot material can include one or more populations of quantum dot material. Exemplary quantum dots or quantum dot material emit green light and red light upon down-conversion of blue primary light from the blue LED to secondary light emitted by the quantum dots. The respective portions of red, green, and blue light can be controlled to achieve a desired white point for the white light emitted by a display device incorporating the quantum dot film article. Exemplary quantum dots for use in quantum dot film articles described herein include CdSe with ZnS shells. Suitable quantum dots for use in quantum dot film articles described herein include core/shell luminescent nanocrystals including CdSe/ZnS, InP/ZnS, PbSe/PbS, CdSe/CdS, CdTe/CdS or CdTe/ZnS. In exemplary embodiments, the luminescent nanocrystals include an outer ligand coating and are dispersed in a polymeric matrix. Quantum dot and quantum dot material are commercially available from Nanosys Inc., Palo Alto, Calif. The quantum dot layer can have any useful amount of quantum dots. In many embodiments the quantum dot layer can have from 0.1 to 1% wt quantum dots.

In one or more embodiments the quantum dot material can include scattering beads or particles. These scattering beads or particles have a different refractive index than the refractive index of the epoxy polymer such as, by at least 0.05 or by at least 0.1. These scattering beads or particles can include polymers such as silicone, acrylic, nylon, etc. These scattering beads or particles can include inorganics such as $TiO_2$, $SiO_x$, $AlO_x$, etc. The inclusion of scattering particles can result in a longer optical path length and improved quantum dot absorption and efficiency. In many embodiments, the particle size is in a range from 1 to 10 micrometers, or from 2 to 6 micrometers. In many embodiments, the quantum dot material can include fillers such fumed silica.

The polymer matrix in the luminescent layer 130 can be any suitable polymer that is compatible with the quantum dot material, and can be, for example, any of the (meth) acrylates described elsewhere for the first and second polymer smoothing layers 114, 124, and the first and second outer polymer layers 118, 128. In one particular embodiment, at least one of the polymers in both the first and second outer polymer layers 118, 128, and the luminescent layer 130, are the same.

Figure 2:
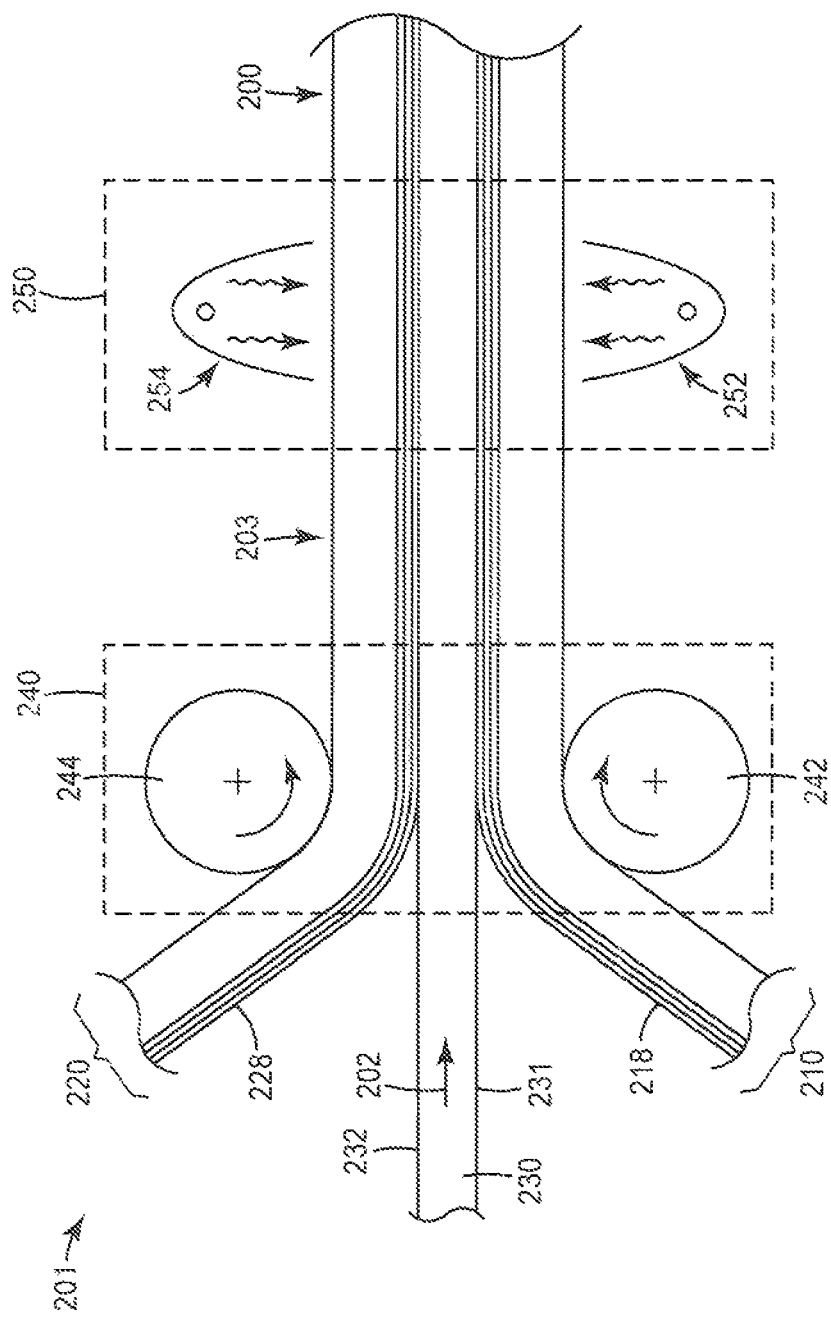
FIG. 2 shows a process for forming a device.

FIG. 2 shows a process 201 for forming a luminescent device 200, according to one aspect of the disclosure. Each of the elements 200-232 shown in FIG. 2 correspond to like-numbered elements 100-132 shown in FIG. 1, which have been described previously. A luminescent layer 230 can be unwound from a roll, extruded or coated from a die, or otherwise provided (technique of providing luminescent layer 230 is not shown), and travels in a direction 202 through a laminator 240 having opposing first and second lamination rollers 242, 244. A first and a optional second barrier film 210, 220 are also unwound from rolls (not shown), enter the laminator 240, and are pressed into contact with first and opposing second major surfaces 231, 232, respectively, of luminescent layer 230, forming an uncured laminate 203. Uncured laminate 203 passes through a curing apparatus 250 where one or more radiation sources 252, 254, preferably UV sources, irradiate the uncured laminate 203 to form the luminescent device 200.

EXAMPLES

Example 1

A barrier film was prepared as follows using on a vacuum coater similar to the coater described in U.S. Pat. No. 5,440,446 (Shaw et al.) and U.S. Pat. No. 7,018,713 (Padiyath, et al). A coating precursor solution of tricyclodecane dimethanol diacrylate (SR833S, Sartomer) was vaporized and coated onto a 2 mil (50 micron) thick by 14 inches (36 cm) wide PET substrate using ultrasonic atomization and flash evaporation making a coating width of 12.5 inches (32 cm). This base acrylate layer was coated at a constant line speed of 16 fpm (5 m/min). The coating was subsequently cured immediately downstream with an electron beam operating at 7.0 kV and 4.0 mA. The flow of liquid into the evaporator was 1.33 ml/min, the gas flowrate was 60 sccm and the evaporator temperature was 260° C. The process drum temperature was 0° C. Immediately downstream of the curing process, a subsequent reactive AC sputtering process deposited a 30 nm silicon aluminum oxide coating at 5 kW power. A third in-line process deposited a second (top) acrylate layer in a similar manner to the first layer, except using an atomizer/flash evaporation process as described in US Patent App. Publication No. 2012/0208033. This second acrylate layer contained a mixture of SR833S with 3 wt % azasilane (N-n-Butyl-Aza-2,2-dimethoxysilacyclopentane from Gelest, Inc., Morrisville, Pa.) and 1 wt % IRGACURE 184 (photoinitiator available from BASF, Florham Park, N.J.). The liquid flowrate was 1.33 ml/min, the gas flowrate was 60 sccm and the evaporator temperature was 260° C. The coating was subsequently cured immediately downstream with a 300 W mercury amalgam ultraviolet source with high emission (about 0.5 $W/m^2$) at 254 nm and minimal emission below 220 nm. The exposure time of UV radiation was varied by varying the line speed during cure.

A laminated film construction was prepared as follows. A 100 μm thick layer of a bisphenol-A based diacrylates mixture (EBECRYL 3600, 114 and 130 all available from Cytec Industries, Inc., Woodland Park, N.J. and DAROCUR 4265 available from BASF, Florham Park, N.J.) shown in Table 1 was coated between two layers of the barrier film. This construction was subsequently UV cured with a high output Fusion F600 D bulb (commercially available from Fusion UV Systems, Inc., Gaithersburg, Md.) at 30 fpm (9.1 m/min).

TABLE 1

| Material | Trade name | Wt % |
|---|---|---|
| Amine modified bisphenol-A diacrylate | EBECRYL 3600 | 59.4% |
| Phenoxy ethyl acrylate | EBECRYL 114 | 19.80% |
| Tricyclodecane dimethanol diacrylate | EBECRYL 130 | 19.8% |
| Photoinitiator | DAROCUR 4265 | 1% |

The barrier film was tested for water vapor permeation on a MOCON PERMATRAN-W® Model 700 WVTR testing system (commercially available from MOCON, Inc., Minneapolis, Minn.) at 50° C. This example tested below the detection limit of 0.005 $g/m^2/day$.

The laminate film construction was measured using a PerkinElmer Lambda 900 (available from PerkinElmer, Inc., Waltham, Mass.) and shown to average 90% transmission from 400-800 nm. The laminate film construction was tested for peel strength according to ASTM D1876-08 "Standard Test Method for Peel Resistance of Adhesives (T-Peel Test)." The peel strength was greater than about 200 g/in (200 g/25 mm) when the times of exposure to the 300 W mercury amalgam UV source was between about 0.1 and about 0.5 seconds, and 100 g/in (100 g/25 mm) or lower when the exposure time was greater than about 1.5 seconds.

Comparative Example C-1

A barrier film was constructed in a similar method as described in Example 1, except electron beam (EB) radiation was used for curing of the second (top) acrylate layer of the barrier film. A laminate film construction using samples of this barrier film with a 100 μm thick acrylate coating was prepared as in Example 1. As shown in Table 2, this construction gave good barrier performance, but had low interlayer adhesion between the e-beam cured barrier film and the 100 μm thick acrylate coating.

Comparative Example C-2

A barrier film was constructed in a similar method as described in Example 1, except a 300 W UV radiation source with high output at 185 nm and 254 nm was used to cure the second (top) acrylate layer of the barrier film. A laminate film construction using samples of this barrier film with a 100 μm thick acrylate coating was prepared as in Example 1. As shown in Table 2, this construction gave good barrier performance, but had low interlayer adhesion between the 185 nm UV cured barrier film and the 100 μm thick acrylate coating.

Comparative Example C-3

A barrier film was constructed in a similar method as described in Example 1, except the second (top) acrylate curing duration was about 2 seconds or longer. A laminate film construction using samples of this barrier film with a 100 μm thick acrylate coating was prepared as in Example 1. As shown in Table 2, this construction gave good barrier performance, but had low interlayer adhesion between the long duration UV cured barrier film and the 100 μm thick acrylate coating.

For samples of Example 1 and Comparative Examples C-2-C-3, peel strength was tested according to ASTM D1876-08 "Standard Test Method for Peel Resistance of Adhesives (T-Peel Test)" and water vapor transmission rate (WVTR) was tested on a MOCON PERMATRAN-W® Model 700 WVTR testing system at 50° C. Results are reported in Tables 2 and 3 below.

TABLE 2

| Property | Example | | | |
|---|---|---|---|---|
| | 1 | C-1 | C-2 | C-3 |
| Barrier Top Layer Acrylate Curing | UV (minimal output below 220 nm, <0.5 second exposure) | EB | UV (high output down to 185 nm) | UV (minimal output below 220 nm, about 2 seconds or greater exposure) |
| Peel force | >200 g/in. | <5 g/in. | <50 g/in. | <50 g/in. |
| WVTR at 50° C. | <0.005 g/m²/day | <0.005 g/m²/day | <0.005 g/m²/day | <0.005 g/m²/day |

An inverse relationship of adhesion and dose was observed. Data from typical e-beam curing gave peel force results less than 5 g/in. Table 3 below shows peel force versus exposure time for the UV source of Example 1 and Comparative Example C-3, which had minimal output below 220 nm, and for the UV source of Comparative Example C-2, which had significant output at 185 nm.

TABLE 3

| | Peel Force (g/in) | |
|---|---|---|
| Exposure Time (seconds) | minimal output below 220 nm | high output down to 185 nm |
| 0.20 | >200 | 30 |
| 0.50 | >200 | 30 |
| 0.75 | 200 | 30 |
| 0.90 | 200 | — |
| 1.25 | 150 | 20 |
| 1.50 | 100 | — |
| 1.75 | 50 | 10 |
| 7.50 | 5 | — |

Example 2

A barrier film was constructed in a similar method as described in Example 1. This barrier film was then coated with about 2 mils (50 microns) of a hot-melt ethylene vinyl acetate (EVA) adhesive. Adhesion was tested by attaching the PET substrate used in Example 1 to the EVA adhesive layer and then testing peel strength according to ASTM D1876-08 "Standard Test Method for Peel Resistance of Adhesives (T-Peel Test)." Low adhesion was observed in the coating process for e-beam cured acrylates for all applied doses that were considered. Good adhesion (peel strength greater than about 200 g/in) was observed for barrier films that were UV cured with 0.1-0.5 second exposure time using the UV source of Example 1 having high 254 nm output and minimal output below 220 nm.

Following are a list of embodiments of the present disclosure.

Item 1 is a device, comprising: a first and a second barrier layer, each comprising at least an outer polymer layer, each outer polymer layer having an adhesive contact surface; and a luminescent layer comprising a polymer matrix disposed between the first and the second barrier layers with the respective adhesive contact surfaces in contact with the luminescent layer, wherein a peel adhesion between the first and the second barrier layers and the luminescent layer is at least 100 grams/inch.

Item 2 is the device of item 1, wherein the peel adhesion between the first and the second barrier layers and the luminescent layer is at least 200 grams/inch.

Item 3 is the device of item 1 or item 2, wherein each of the first and second barrier layers further comprise at least one layer of inorganic oxide.

Item 4 is the device of item 1 to item 3, wherein at least one of the first and second barrier layers further comprises a substrate selected from a flexible glass, a metal foil, or a polymer film.

Item 5 is the device of item 1 to item 4, wherein the luminescent layer further comprises at least one quantum dot.

Item 6 is the device of item 1 to item 5, wherein the polymer matrix comprises a curable (meth)acrylate, a curable epoxy, or a combination thereof.

Item 7 is the device of item 1 to item 6, wherein the luminescent layer and each of the outer polymer layers are cured while in contact with each other.

Item 8 is the device of item 1 to item 7, wherein each of the outer polymer layers comprise a radiation cured (meth)acrylate and optionally a silane coupling agent.

Item 9 is the device of item 1 to item 8, wherein the luminescent layer and each of the outer polymer layers are cured together using an ultraviolet (UV) light source, a visible light source, a thermal source, or a combination thereof.

Item 10 is a device, comprising: a barrier film, comprising: a substrate having opposing first and second major surfaces; an inorganic oxide layer adjacent the second major surface; a smoothing polymeric layer between the second major surface and the inorganic oxide layer; an outer polymer layer disposed on the inorganic oxide layer, opposite the smoothing polymeric layer; and a bonding layer disposed adjacent the outer polymer layer, wherein a peel adhesion between the barrier film and the bonding layer is at least 100 grams/inch.

Item 11 is the device of item 10, wherein the smoothing polymeric layer comprises an electron beam cured (meth)acrylate.

Item 12 is the device of item 10 or item 11, wherein the bonding layer comprises a radiation cured (meth)acrylate and optionally a silane coupling agent.

Item 13 is the device of item 10 to item 12, wherein the outer polymer layer comprises a UV radiation cured (meth)acrylate and optionally a silane coupling agent.

Item 14 is the device of item 10 to item 13, wherein the peel adhesion between the barrier film and the bonding layer is at least 200 grams/inch.

Item 15 is the device of item 10 to item 14, wherein the substrate is selected from a flexible glass, a metal foil, or a polymer film.

Item 16 is the device of item 10 to item 15, further comprising a second barrier film, comprising: a second substrate having opposing third and fourth major surfaces; a second inorganic oxide layer adjacent the fourth major surface; a second smoothing polymeric layer between the fourth major surface and the second inorganic oxide layer; and a second outer polymer layer disposed on the second inorganic oxide layer, opposite the second smoothing polymeric layer, wherein the bonding layer is disposed adjacent the second inorganic oxide layer and opposite the second smoothing polymeric layer.

Item 17 is the device of item 16, wherein the second smoothing polymeric layer comprises an electron beam cured (meth)acrylate.

Item 18 is the device of item 16 or item 17, wherein the second outer polymer layer comprises a UV radiation cured (meth)acrylate and optionally a silane coupling agent.

Item 19 is the device of item 16 to item 18, wherein the second substrate is selected from a flexible glass, a metal foil, or a polymer film.

Item 20 is the device of item 10 to item 19, wherein the bonding layer comprises a luminescent layer.

Item 21 is the device of item 20, wherein the luminescent layer further comprises at least one quantum dot.

Item 22 is the device of item 10 to item 21, wherein the bonding layer comprises a hot-melt adhesive.

Item 23 is the device of item 22, wherein the hot-melt adhesive comprises ethylene vinyl acetate.

Item 24 is a method of forming a device, comprising: forming a barrier film in an evacuated chamber, the barrier film comprising an outer radiation curable polymer layer; at least partially curing the outer radiation curable polymer layer so as to form an adhesive contact surface on the barrier film; and forming a bonding layer on the adhesive contact surface.

Item 25 is the method of item 24, wherein the barrier film is removed from the evacuated chamber prior to forming the bonding layer on the adhesive contact surface.

Item 26 is the method of item 24 or item 25, wherein the bonding layer is a hot-melt adhesive layer, and forming the bonding layer comprises laminating or coating the hot-melt adhesive layer on the adhesive contact surface.

Item 27 is the method of item 24 to item 26, wherein the at least partially curing comprises ultraviolet (UV) radiation curing.

Item 28 is the method of item 24 to item 27, wherein the outer radiation curable polymer layer comprises a radiation curable (meth)acrylate.

Item 29 is the method of item 24 to item 28, wherein the outer radiation curable polymer layer further comprises a silane coupling agent.

Item 30 is the method of item 24 to item 29, wherein the outer radiation curable polymer layer further comprises a polymerization inhibitor.

Item 31 is the method of item 30, wherein the polymerization inhibitor comprises an anaerobic polymerization inhibitor.

Item 32 is the method of item 31, wherein the anaerobic polymerization inhibitor is selected from diethylhydroxyl amine, tetramethyl phenylene diamine, salicylaldoxime, tetramethyl phenylene diamine, manganese acetate, 4-hydroxy TEMPO, NPAL, or phenothiazine, and combinations thereof.

Item 33 is the method of item 24 to item 32, wherein the bonding layer and the outer radiation curable polymer layers are further cured together using an ultraviolet (UV) light source, a visible light source, a thermal source, or a combination thereof.

Item 34 is the method of item 24 to item 33, wherein the barrier film comprises as substrate opposite the outer radiation curable polymer layer, the substrate selected from a flexible glass, a metal foil, or a polymer film.

Item 35 is a method of forming a device, comprising: forming a barrier film in an evacuated chamber, the barrier film comprising an outer radiation curable polymer layer; at least partially curing the outer radiation curable polymer layer so as to form an adhesive contact surface on the barrier film; laminating the barrier film to a bonding layer comprising a curable polymer matrix, so that the adhesive contact surface contacts the bonding layer; and curing the laminate.

Item 36 is the method of item 35, wherein the barrier film is removed from the evacuated chamber prior to laminating the barrier film to the bonding layer.

Item 37 is the method of item 35 or item 36, wherein the at least partially curing comprises ultraviolet (UV) radiation curing.

Item 38 is the method of item 35 to item 37, wherein curing the laminate comprises thermal curing, ultraviolet (UV) radiation curing, visible light radiation curing, electron-beam curing, or a combination thereof.

Item 39 is the method of item 35 to item 38, wherein the bonding layer comprises opposing first and second major surfaces, and laminating the barrier film comprises laminating the barrier film to each of the first and second major surfaces of the bonding layer.

Item 40 is the method of item 35 to item 39, wherein the outer radiation curable polymer layer comprises a radiation curable (meth)acrylate.

Item 41 is the method of item 35 to item 40, wherein the outer radiation curable polymer layer further comprises a silane coupling agent.

Item 42 is the method of item 35 to item 41, wherein the outer radiation curable polymer layer further comprises a polymerization inhibitor.

Item 43 is the method of item 35 to item 42, wherein the polymerization inhibitor comprises an anaerobic polymerization inhibitor.

Item 44 is the method of item 35 to item 43, wherein the anaerobic polymerization inhibitor is selected from diethylhydroxyl amine, tetramethyl phenylene diamine, salicylaldoxime, tetramethyl phenylene diamine, manganese acetate, 4-hydroxy TEMPO, NPAL, or phenothiazine, and combinations thereof.

Item 45 is the method of item 35 to item 44, wherein the bonding layer and the outer radiation curable polymer layers are cured together using an ultraviolet (UV) light source, a visible light source, a thermal source, or a combination thereof.

Item 46 is the method of item 35 to item 45, wherein the curable polymer matrix comprises a (meth)acrylate monomer and at least one quantum dot.

Item 47 is the method of item 35 to item 46, wherein the barrier film further comprises at least one layer of inorganic oxide.

Item 48 is the method of item 35 to item 47, wherein at least partially curing comprises using UV radiation with a wavelength spectrum centered around about 254 nm and with substantially no output with a wavelength below 220 nm.

Item 49 is the method of item 35 to item 48, wherein at least partially curing comprises exposing to UV radiation of less than about 0.5 W/m$^2$ intensity for between 0.1 seconds and 1.5 seconds.

Item 50 is the method of item 35 to item 49, wherein at least partially curing comprises exposing to a 254 nm UV intensity of about 0.5 W/m$^2$ for a duration of from about 0.1 to about 1.5 seconds.

Item 51 is the method of item 35 to item 50, wherein at least partially curing comprises using visible light radiation curing.

Item 52 is the method of item 35 to item 51, wherein the barrier film comprises as substrate opposite the outer radiation curable polymer layer, the substrate selected from a flexible glass, a metal foil, or a polymer film.

Item 53 is a display, comprising: a device according to any of item 1 to item 23; a light disposed to illuminate the device; and a liquid crystal display panel disposed between the light and the device.

Unless otherwise indicated, all numbers expressing feature sizes, amounts, and physical properties used in the specification and claims are to be understood as being modified by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

All references and publications cited herein are expressly incorporated herein by reference in their entirety into this disclosure, except to the extent they may directly contradict this disclosure. Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. A device, comprising:
   a first and a second barrier layer, each comprising at least an outer polymer layer, each outer polymer layer having an adhesive contact surface; and
   a luminescent layer comprising a luminescent nanocrystals dispersed in a polymer matrix disposed between the first and the second barrier layers with the respective adhesive contact surfaces in contact with the luminescent layer,
   wherein a peel adhesion between the first and the second barrier layers and the luminescent layer is at least 100 grams/inch.

2. The device of claim 1, wherein the peel adhesion between the first and the second barrier layers and the luminescent layer is at least 200 grams/inch.

3. The device of claim 1, wherein the luminescent nanocrystals comprise quantum dots.

4. The device of claim 1, wherein the polymer matrix comprises a curable (meth)acrylate, a curable epoxy, or a combination thereof.

5. The device of claim 1, wherein each of the outer polymer layers comprise a radiation cured (meth)acrylate and optionally a silane coupling agent.

6. A display, comprising:
   a device according to claim 1;
   a light disposed to illuminate the device; and
   a liquid crystal display panel disposed between the light and the device.

* * * * *